United States Patent [19]
Tsai et al.

[11] Patent Number: 5,570,375
[45] Date of Patent: Oct. 29, 1996

[54] IEEE STD. 1149.1 BOUNDARY SCAN CIRCUIT CAPABLE OF BUILT-IN SELF-TESTING

[75] Inventors: Ching-Hong Tsai; Fang-Diahn Guo; Jin-Hua Hong; Cheng-Wen Wu, all of Hsinchu, Taiwan

[73] Assignee: National Science Council of R.O.C., Taipei, Taiwan

[21] Appl. No.: 438,417

[22] Filed: May 10, 1995

[51] Int. Cl.[6] ........................................ G01R 31/28
[52] U.S. Cl. .................................. 371/22.3; 395/183.06
[58] Field of Search ................................ 371/22.3, 22.4, 371/22.5, 25.1, 27; 395/183.06

[56] References Cited

U.S. PATENT DOCUMENTS 5,042,034  8/1991  Correale, Jr. et al. .

OTHER PUBLICATIONS

C. S. Gloster & F. Brglez, *1988 Int'l Test Conf.*, Paper 7.2:138–145 (1988).
C. S. Gloster & F. Brglez, *IEEE Design & Test Of Computers*, (Feb. 1989):36–44.
C. W. Yau & N. Jawala, *1990 Int'l Test Conf.*, Paper 16.3:311–315 (1990).
N. Jarwala and B. W. Yau, *1991 Int'l Test Conf.*, Paper 243:649–658.
T. Langford, *Int'l Test Conf.*, 1993 Paper 6.2:167–173.

*Primary Examiner*—Vincent P. Canney
*Attorney, Agent, or Firm*—Morgan & Finnegan, LLP

[57] ABSTRACT

An IEEE Std. 1149.1 boundary scan circuit which is capable of performing built-in self-testing includes a logic circuit, cascaded input boundary-scan cells that form an input boundary-scan register connected to input nodes of the logic circuit, cascaded output boundary-scan cells that form an output boundary-scan register connected to output nodes of the logic circuit, and a test access port system for controlling operation of the input and output boundary-scan cells. The test access port system provides a built-in self-test control signal to the input and output boundary-scan cells when executing built-in self-testing. The input boundary-scan register is reconfigurable to operate as a test pattern generator that provides test patterns to the logic circuit for a predetermined number of clock cycles upon receipt of the built-in self-test control signal. The output boundary-scan register is reconfigurable to operate as an output response analyzer that is driven by the logic circuit for the predetermined number of clock cycles upon receipt of the built-in self-test control signal. A family of input and output boundary-scan cells that can be reconfigured as a linear feedback shift register and as a multiple-input shift register is also disclosed.

13 Claims, 8 Drawing Sheets

| Instruction | Code | Mode | BIST* | DR_select |
|---|---|---|---|---|
| EXTEST | 00 | 1 | 1 | 0 |
| BYPASS | 11 | 0 | 1 | 1 |
| SAMPLE/PRELOAD | 01 | 0 | 1 | 0 |
| RUNBIST | 10 | 1 | 0 | 0 |

IEEE STD. 1149.1 BOUNDARY SCAN CIRCUIT CAPABLE OF BUILT-IN SELF-TESTING

BACKGROUND OF THE INVENTION

1. Field of the Invention

The invention relates to a boundary scan circuit and to a testing method performed thereby, more particularly to a built-in self-testing method for an IEEE Std. 1149.1 boundary scan circuit and to an IEEE Std. 1149.1 boundary scan circuit with a built-in self-testing capability.

2. Description of the Related Art

Built-in self-test (BIST), which is defined as the testing of an integrated circuit through built-in hardware features, is a testing method which can overcome testing problems usually encountered when conducting tests for complex VLSI circuits. Chip level BIST architecture involves: a test pattern generator, such as a linear feedback shift register (LFSR), connected to input nodes of an application logic; an output response analyzer, such as a multiple input signature register (MISR), connected to output nodes of the application logic; and a test controller for controlling operation of the test pattern generator and the output response analyzer.

Figure 1:
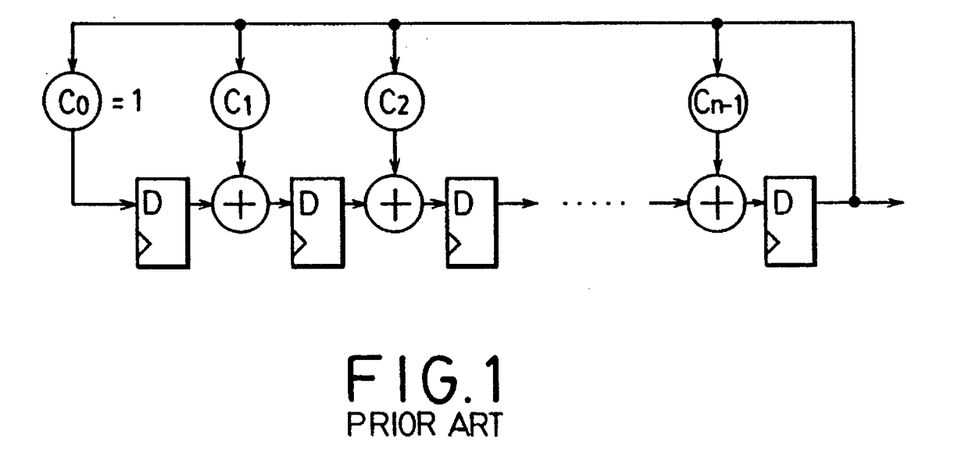
FIG. 1 is a block diagram of a conventional linear feedback shift register (LFSR)
Figure 2:
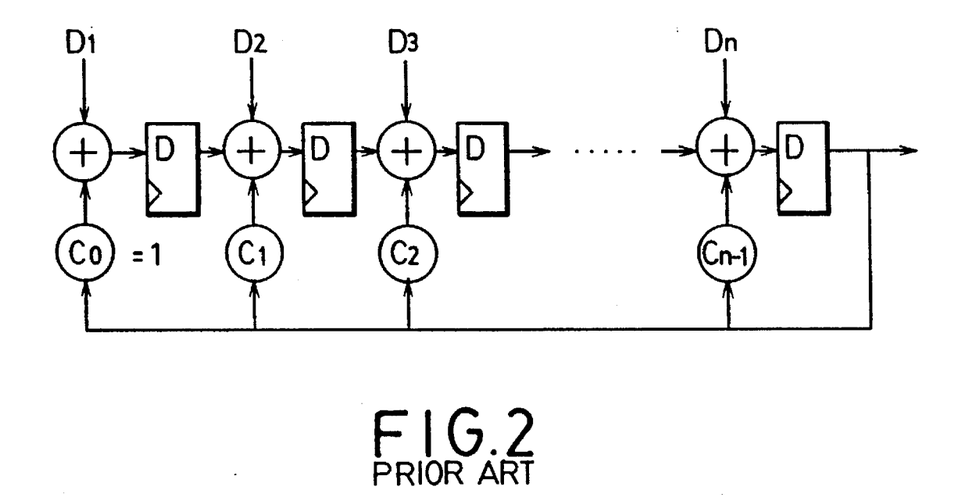
FIG. 2 is a block diagram of a conventional multiple-input shift register (MISR)

LFSRs are well studied and widely used in VLSI circuitry because they are simple and fairly regular in structure, which are important for VLSI implementation. They are also used extensively in design for testability (DFT) techniques because their shift property integrates easily with serial scan. Their good performance in pseudo-exhaustive and pseudo-random pattern generation, and their ability to compress the circuit output response also make them popular in BIST environments. FIGS. 1 and 2 respectively show the circuit designs of an LFSR and an MISR having the characteristic polynomial $p(x)=1+c_1x+c_2x^2+\ldots+c_nx^n$.

Since BIST permits execution of the testing operation at the speed of the system clock, testing can be performed at a much shorter time than other known testing techniques. In addition, BIST does not require the use of an Automatic Test Equipment (ATE). However, the silicon area must be increased to accommodate the test pattern generator, the output response analyzer and the test controller. This results in a lower chip yield and in higher manufacturing costs.

Recent advancements in the field of electronics manufacturing, such as surface mount technology (SMT) and multichip module (MCM), have caused numerous testing problems at the board level. The IEEE has issued a boundary scan standard (IEEE Std. 1149.1) to help alleviate the problem of testing connections at this level.

Figure 3:
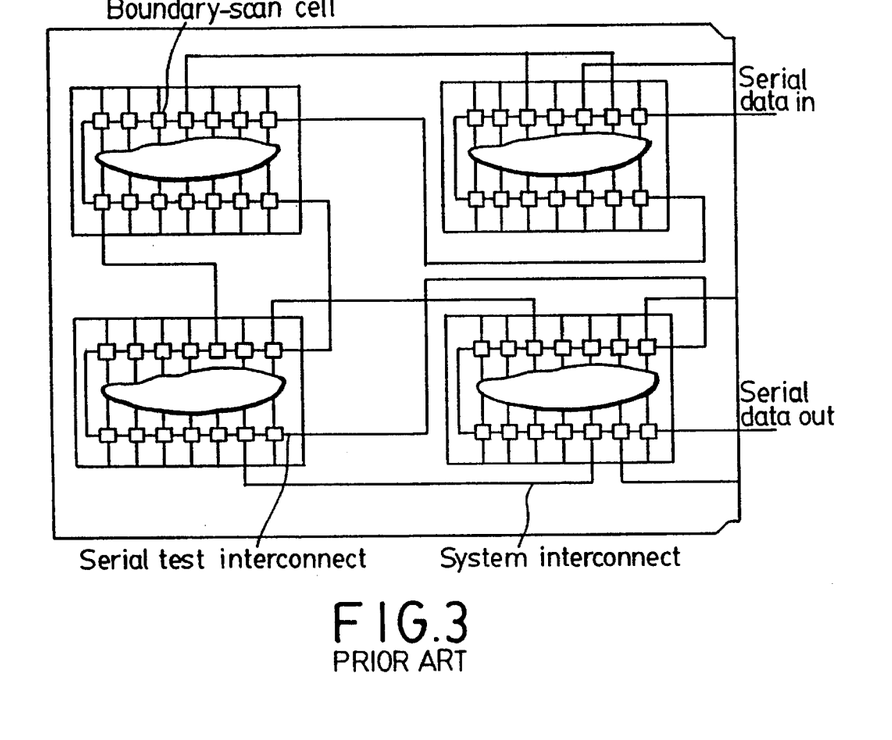
FIG. 3 illustrates a conventional boundary scannable board design.

IEEE Std. 1149.1 provides a framework for reducing the test costs at board level by reusing pre-existing test patterns to a component on a board regardless of how pins of the component are interconnected. FIG. 3 illustrates a boundary scannable board design. A boundary-scan cell is provided adjacent to each component pin so that signals at component boundaries can be controlled and observed to determine whether a short circuit or open circuit condition has occurred on the board, and to detect the presence of a fault in an integrated circuit on a circuit board. Also, in-circuit testing is achieved by mere use of a special instruction to shift the pre-existing test patterns to the chip boundary, thereby simplifying testing at the board level. Moreover, the input and output boundary-scan cells, which cooperate to form input and output boundary-scan registers, can facilitate design debugging and fault diagnosis since the boundary-scan registers can be used to sample data flowing through the component without interfering with normal operation of the latter.

Figure 4:
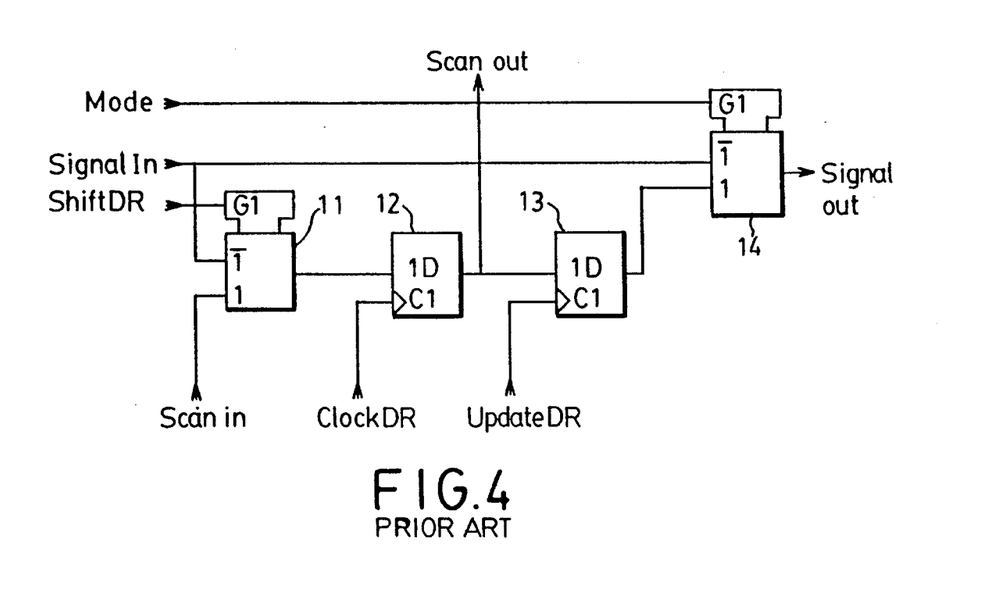
FIG. 4 is a schematic circuit diagram of a conventional boundary-scan cell.

Referring to FIG. 4, a conventional boundary-scan cell of an IEEE Std. 1149.1 boundary scan circuit is shown to comprise a two-channel first multiplexer 11, a D-type first flip-flop 12, a D-type second flip-flop 13, and a two-channel second multiplexer 14. The first multiplexer 11 has a first data input which serves as a signal input, a second data input which serves as a scan input, a channel select input which receives a first control signal ShiftDR, and an output. The first flip-flop 12 has a data input connected to the output of the first multiplexer 11, a clock input for receiving a first clock signal ClockDR, and an output which serves as a scan output. The second flip-flop 13 has a data input connected to the output of the first flip-flop 12, a clock input for receiving a second clock signal UpdateDR, and an output. The second multiplexer 14 has a first data input which serves as a signal input, a second data input which is connected to the output of the second flip-flop 13, a channel select input which receives a second control signal Mode, and an output which serves as a signal output.

Figure 5:
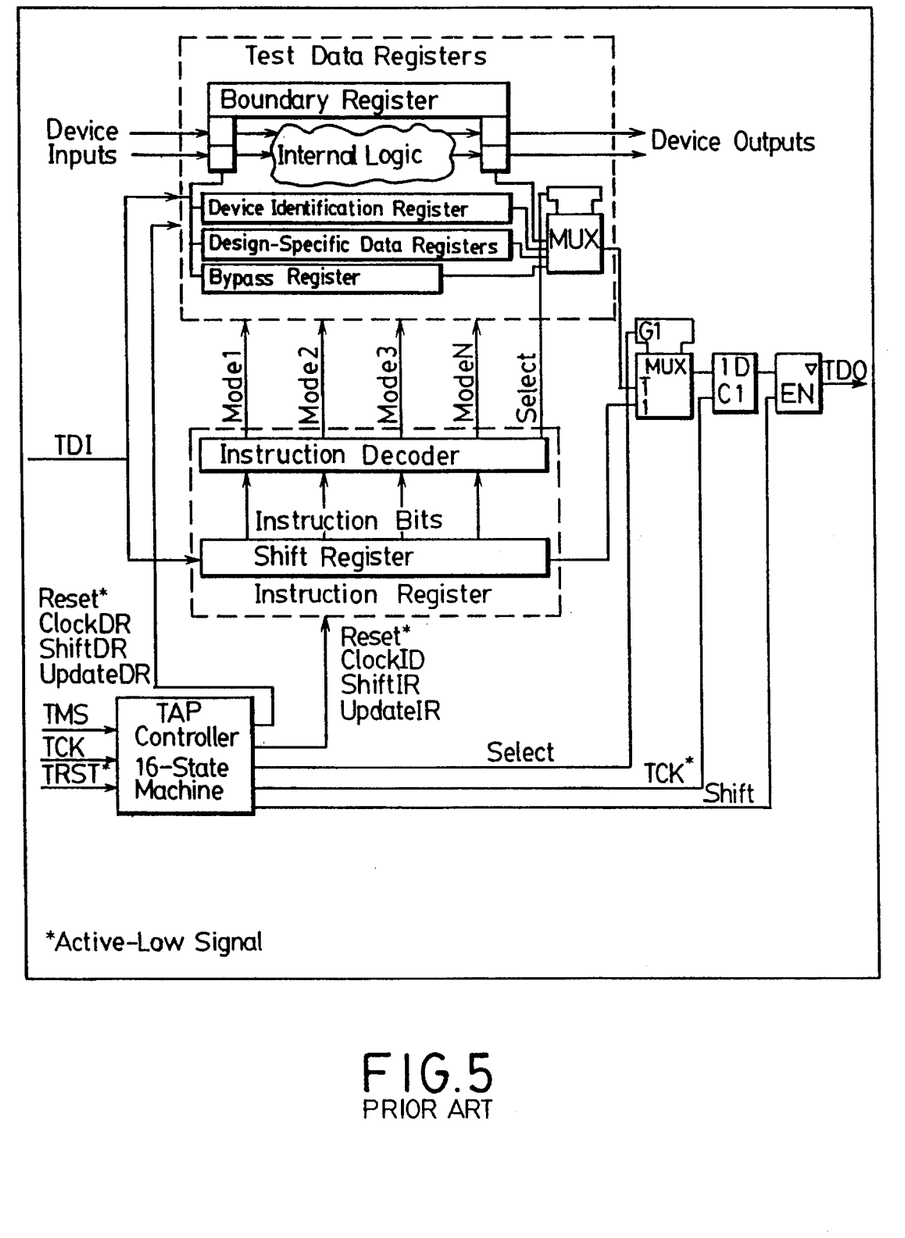
FIG. 5 is a circuit block diagram of a conventional boundary-scan device.

Referring to FIG. 5, the boundary scan test circuitry includes a test access port (TAP) system. Testing is performed by shifting test instructions and test data into the boundary-scan component via the TAP system. The TAP system is a 16-state system and has several input ports and one output port. These ports include: Test Data In (TDI) which provides serial inputs for test instructions shifted into the instruction register and for data shifted through the boundary-scan register or other test data registers; Test Data Out (TDO) which is the serial output for test instructions and data from the test data registers; Test Clock (TCK) which provides the clock for the test logic and which is a dedicated input that allows the serial test data path to be used independent of component-specific system clocks and that permits shifting of test data concurrently with normal component operation; Test Mode Select (TMS) which cooperates with TCK to cause operation of the TAP system from one state to another; and Test Reset (TRST*) which is an active-low input signal that provides asynchronous initialization of the TAP system.

Boundary scan test functions are accomplished via various test instructions which are defined by IEEE Std. 1149.1. Three of these test instructions, EXTEST, SAMPLE/PRELOAD and BYPASS, are mandatory for every boundary-scan device.

The EXTEST instruction is concerned primarily with testing of circuitry external to the device using the boundary-scan register of the device. A test vector is pre-loaded into the boundary-scan register, and the EXTEST instruction is used to drive the test vector to the external circuitry. When the EXTEST instruction is used to test the interconnection line, a test pattern is pre-loaded into the output boundary-scan register of one device and is then propagated to the next device. The response is latched on the input cells and is shifted to the TDO for examination. The EXTEST instruction also permits cluster testing, wherein components that do not incorporate boundary scan technology are tested. In cluster testing, data is shifted to the cluster/device input cells. Outputs from the cluster are captured by the input cells of a second boundary-scan device. The captured data is then shifted out of the second boundary-scan device for examination.

The BYPASS instruction allows the TDO buffer to generate the same bit stream as TDI. This is done by placing a single shift-register, called the bypass register, between TDI and TDO. When one does not wish to test a particular component, but the test data sequence must shift through that component to test another device, the BYPASS instruction is issued to that particular component to bypass the test data sequence.

The SAMPLE/PRELOAD instruction permits the execution of two functions: it allows sampling of normal operation data at the periphery of a component, and placing of an initial data pattern at latched parallel outputs of the boundary-scan cells. This instruction is used to load data onto the latched outputs prior to selection of another test instruction, such as the EXTEST instruction.

As with BIST, boundary scan technology requires an increase in the silicon area to accommodate the TAP system and the input and output boundary-scan registers.

The general acceptance of boundary scan by the designer and the Automatic Test Equipment (ATE) community makes boundary scan an effective test strategy. The incorporation of BIST with the boundary scan registers and the TAP controller provides a flexible framework at all levels of testing—chip level, board level and system level.

Although the use of BIST in a boundary scan environment has been proposed beforehand, the traditional approach is to provide separate hardware for performing BIST and boundary scan test. This increases the hardware overhead incurred.

SUMMARY OF THE INVENTION

One object of the present invention is to provide a built-in self-testing method for an IEEE Std. 1149.1 boundary scan circuit which involves sharing of flip-flops and controllers between BIST and boundary scan testing so that no substantial increase in the hardware overhead is incurred.

A second object of the present invention is to provide an IEEE Std. 1149.1 boundary scan circuit with a built-in self-testing capability which incorporates boundary-scan cells that are operable so as to perform both BIST and boundary scan test.

A third object of the present invention is to provide a test pattern generator, such as a linear feedback shift register, which utilizes input boundary-output boundary-scan cells when executing built-in self-testing;

reconfiguring the input boundary-scan register to operate as a test pattern generator that provides test patterns to the logic circuit for a predetermined number of clock cycles upon receipt of the built-in self-test control signal;

reconfiguring the output boundary-scan register to operate as an output response analyzer that is driven by the logic circuit for the predetermined number of clock cycles upon receipt of the built-in self-test control signal; and scanning contents of the output boundary-scan register and comparing the contents of the output boundary-scan register with a predetermined signature to detect presence of a fault after the predetermined number of clock cycles.

According to another aspect of the present invention, an IEEE Std. 1149.1 boundary scan circuit capable of performing built-in self-testing includes a logic circuit, cascaded input boundary-scan cells that form an input boundary-scan register connected to input nodes of the logic circuit, cascaded output boundary-scan cells that form an output boundary-scan register connected to output nodes of the logic circuit, and a test access port system for controlling operation of the input and output boundary-scan cells. The test scan cells of an IEEE Std. 1149.1 boundary scan circuit to provide test patterns to a logic circuit when executing BIST.

A fourth object of the present invention is to provide an output response analyzer, such as a multiple-input shift register, which utilizes output boundary-scan cells of an IEEE Std. 1149.1 boundary scan circuit that are driven by a logic circuit when executing BIST.

A fifth object of the present invention is to provide a family of input and output boundary-scan cells for an IEEE Std. 1149.1 boundary scan circuit that can be reconfigured to operate as a test pattern generator or as an output response analyzer when executing BIST.

According to one aspect of the present invention, a built-in self-testing method for an IEEE Std. 1149.1 boundary scan circuit which includes a logic circuit, cascaded input boundary-scan cells that form an input boundary-scan register connected to input nodes of the logic circuit, cascaded output boundary-scan cells that form an output boundary-scan register connected to output nodes of the logic circuit, and a test access port system for controlling operation of the input and output boundary-scan cells, comprises the steps of:

controlling the test access port system to provide a built-in self-test control signal to the input and access port system includes controllable means for providing a built-in self-test control signal to the input and output boundary-scan cells when executing built-in self-testing, in addition to the original test access port defined by IEEE Std. 1149.1—1990. The input boundary-scan register is reconfigurable to operate as a test pattern generator that provides test patterns to the logic circuit for a predetermined number of clock cycles upon receipt of the built-in self-test control signal, and the output boundary-scan register is reconfigurable to operate as an output response analyzer that is driven by the logic circuit for the predetermined number of clock cycles upon receipt of the built-in self-test control signal. Contents of the output boundary-scan register are scannable for comparison with a predetermined signature to detect presence of a fault after the predetermined number of clock cycles.

The test access port system operates in a Run-Test/Idle mode when built-in self-testing is executed. The boundary scan circuit further comprises means for providing a system clock to the input and output boundary-scan cells when built-in self-testing is executed.

According to still another aspect of the present invention, a linear feedback shift register, which acts as a test pattern generator, comprises cascaded input boundary-scan cells of an IEEE Std. 1149.1 boundary scan circuit. The input boundary-scan cells form an input boundary-scan register that is adapted to be connected to input nodes of a logic circuit of the boundary scan circuit. The input boundary-scan register is reconfigurable to operate as a test pattern generator that is adapted to provide test patterns to the logic circuit for a predetermined number of clock cycles upon receipt of a built-in self-test control signal from a test access port system of the boundary scan circuit.

According to a further aspect of the present invention, a multiple-input shift register, which acts as an output response analyzer, comprises cascaded output boundary-scan cells of an IEEE Std. 1149.1 boundary scan circuit. The output boundary-scan cells form an output boundary-scan register that is adapted to be connected to output nodes of a logic circuit of the boundary scan circuit. The output boundary-scan register is reconfigurable to operate as an output response analyzer driven by the logic circuit for a predetermined number of clock cycles upon receipt of a built-in self-test control signal from a test access port system of the boundary scan circuit. Contents of the output boundary-scan register are scannable for comparison with a predetermined signature to detect presence of a fault after the predetermined number of clock cycles.

Since no separate test pattern generator, output response analyzer and BIST controller is required in the BIST boundary scan circuitry of this invention, no substantial increase in the overall hardware overhead is incurred.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

In the boundary scan circuit of the present invention, the input boundary-scan register should be reconfigurable as a pseudo-random pattern generator (PRPG), while the output boundary-scan register should be reconfigurable as a signature analyzer (SA) to incorporate the BIST capability in the boundary scan environment. To achieve this purpose, a family of boundary-scan cells which can be reconfigured as a linear feedback shift register (LFSR) or as a multiple-input shift register (MISR) is disclosed.

Figure 6:
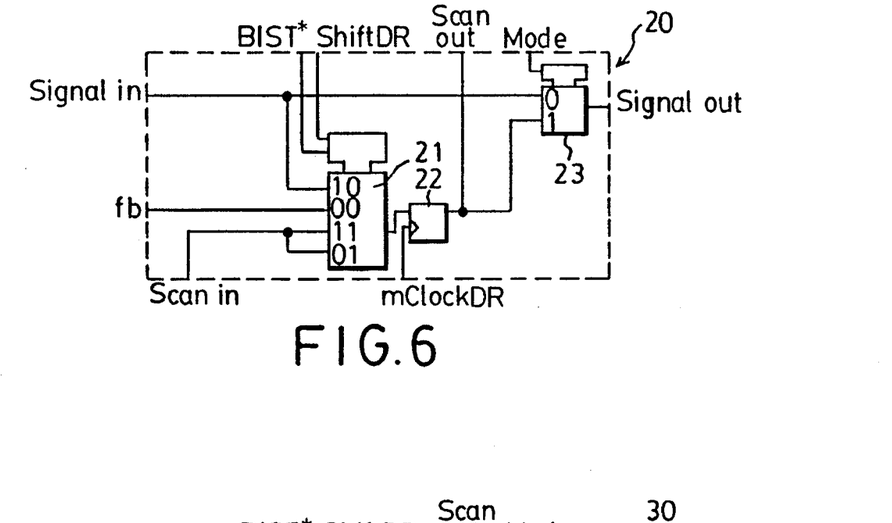
FIG. 6 is a schematic circuit diagram of a first input boundary-scan cell according to the present invention.
Figure 7:
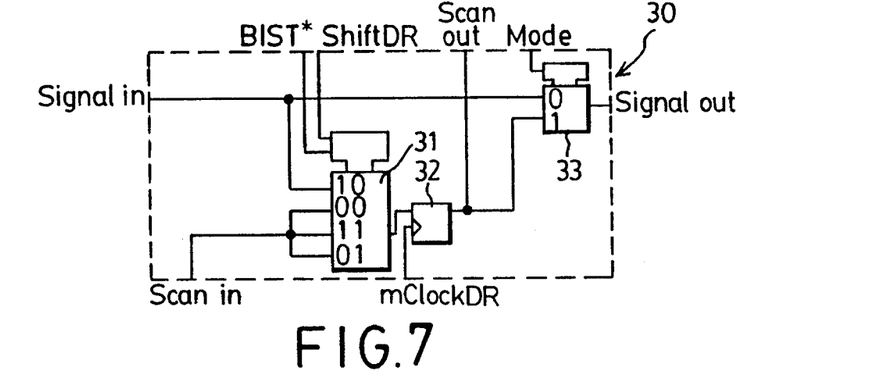
FIG. 7 is a schematic circuit diagram of a second input boundary-scan cell according to the present invention.
Figure 8:
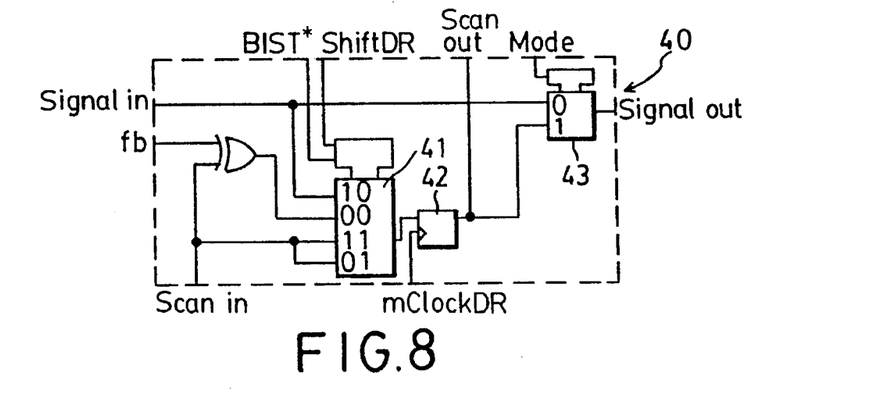
FIG. 8 is a schematic circuit diagram of a third input boundary-scan cell according to the present invention.

FIGS. 6 to 8 illustrate three input boundary-scan cells 20, 30, 40 which can be combined to form an LFSR.

Referring to FIG. 6, the input boundary-scan cell 20 comprises a four-channel first multiplexer 21, a D-type flip-flop 22, and a two-channel second multiplexer 23. The first multiplexer 21 has a first data input which serves as a signal input, a second data input which serves as a feedback input fb, third and fourth data inputs which are connected to one another and which serve as a scan input, a pair of channel select inputs which receive a first control signal BIST* and a second control signal ShiftDR respectively, and an output. The flip-flop 22 has a data input connected to the output of the first multiplexer 21, a clock input for receiving a clock signal mClockDR, and an output which serves as a scan output. The second multiplexer 23 has a first data input which is connected to the first data input of the first multiplexer 21, a second data input which is connected to the output of the flip-flop 22, a channel select input which receives a third control signal Mode, and an output which serves as a signal output.

Referring to FIG. 7, the input boundary-scan cell 30 comprises a four-channel first multiplexer 31, a D-type flip-flop 32, and a two-channel second multiplexer 33. The first multiplexer 31 has a first data input which serves as a signal input, second, third and fourth data inputs which are connected to one another and which serve as a scan input, a pair of channel select inputs which receive the first control signal BIST* and the second control signal ShiftDR respectively, and an output. The flip-flop 32 has a data input connected to the output of the first multiplexer 31, a clock input for receiving the clock signal mClockDR, and an output which serves as a scan output. The second multiplexer 33 has a first data input which is connected to the first data input of the first multiplexer 31, a second data input which is connected to the output of the flip-flop 32, a channel select input which receives the third control signal Mode, and an output which serves as a signal output.

Referring to FIG. 8, the input boundary-scan cell 40 comprises a four-channel first multiplexer 41, a D-type flip-flop 42, a two-channel second multiplexer 43 and a two-input exclusive-OR (XOR) gate 44. The XOR gate 44 has a first input which serves as a feedback input fb, a second input which serves as a scan input, and an output. The first multiplexer 41 has a first data input which serves as a signal input, a second data input which is connected to the output of the XOR gate 44, third and fourth data inputs which are connected to one another and which are further connected to the second input of the XOR gate 44, a pair of channel select inputs which receive the first control signal BIST* and the second control signal ShiftDR respectively, and an output. The flip-flop 42 has a data input connected to the output of the first multiplexer 41, a clock input for receiving a clock signal mClockDR, and an output which serves as a scan output. The second multiplexer 43 has a first data input which is connected to the first data input of the first multiplexer 41, a second data input which is connected to the output of the flip-flop 42, a channel select input which receives the third control signal Mode, and an output which serves as a signal output.

Figure 9:
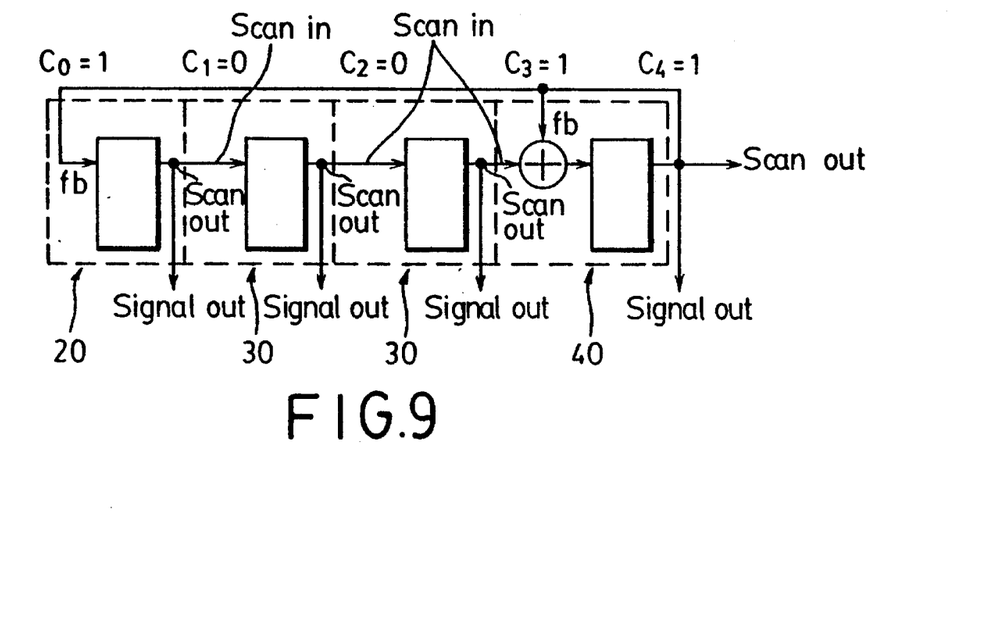
FIG. 9 illustrates how the family of input boundary-scan cells shown in FIGS. 6 to 8 are combined to form an LFSR with a characteristic polynomial $p(x)=x^4+x^3+1$.

FIG. 9 illustrates how the input boundary-scan cells 20, 30, 40 are combined to form an LFSR with a characteristic polynomial $p(x)=1+x^3+x^4$. The LFSR has four cascaded stages that are arranged, from left to right, in the following manner: The first stage consists of the boundary-scan cell 20 and corresponds to a coefficient $c_0$ of the characteristic polynomial. The succeeding stages consist of the boundary-scan cell 30 if a coefficient $c_i$ of the characteristic polynomial is zero for $1 \leq i \leq n-1$, and consist of the boundary-scan cell 40 if the coefficient $c_i$ of the characteristic polynomial is one for $1 \leq i \leq n-1$. A previous stage corresponding to the coefficient $c_{i-1}$ of the characteristic polynomial is connected to a succeeding stage corresponding to the coefficient $c_i$ of the characteristic polynomial by connecting the scan output of the previous stage to the scan input of the succeeding stage. Feedback inputs of the different stages are connected to the scan output of a final stage corresponding to the coefficient $c_{n-1}$ of the characteristic polynomial.

Figure 10:
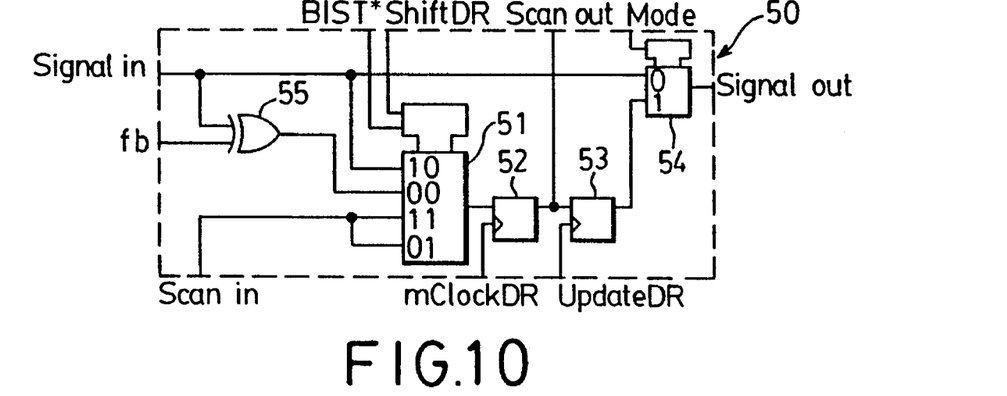
FIG. 10 is a schematic circuit diagram of a first output boundary-scan cell according to the present invention.
Figure 11:
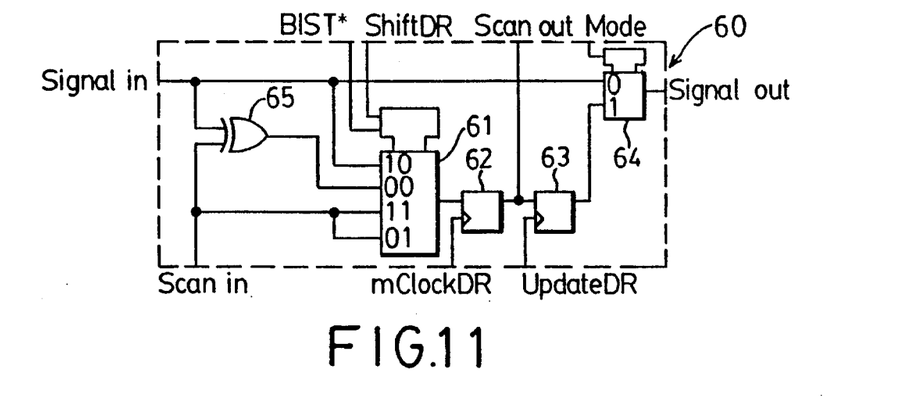
FIG. 11 is a schematic circuit diagram of a second output boundary-scan cell according to the present invention.
Figure 12:
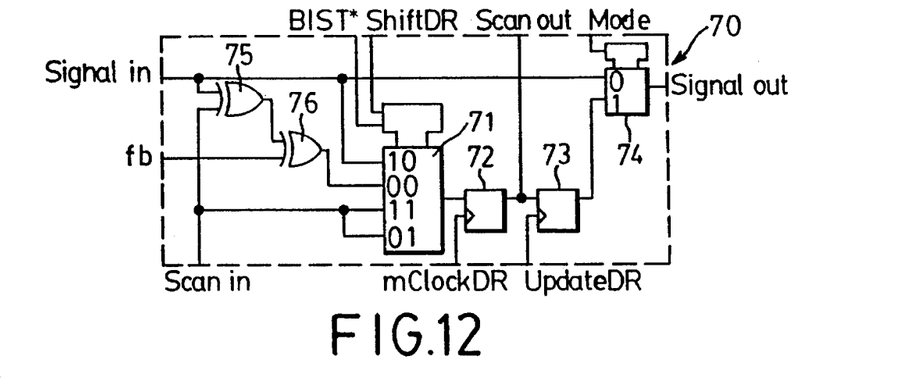
FIG. 12 is a schematic circuit diagram of a third output boundary-scan cell according to the present invention.

FIGS. 10 to 12 illustrate three output boundary-scan cells 50, 60, 70 which can be combined to form an MISR.

Referring to FIG. 10, the output boundary-scan cell 50 comprises a four-channel first multiplexer 51, a D-type first flip-flop 52, a D-type second flip-flop 53, a two-channel second multiplexer 54, and a two-input XOR gate 55. The XOR gate 55 has a first input which serves as a signal input, a second input which serves as a feedback input fb, and an output. The first multiplexer 51 has a first data input which is connected to the first input of the XOR gate 55, a second data input which is connected to the output of the XOR gate 55, third and fourth data inputs which are connected to one another and which serve as scan inputs, a pair of channel select inputs which receive the first control signal BIST* and the second control signal ShiftDR respectively, and an output. The first flip-flop 52 has a data input connected to the output of the first multiplexer 51, a clock input for receiving a first clock signal mClockDR, and an output which serves as a scan output. The second flip-flop 53 has a data input connected to the output of the first flip-flop 52, a clock input for receiving a second clock signal UpdateDR, and an output. The second multiplexer 54 has a first data input which is connected to the first input of the XOR gate 55, a second data input which is connected to the output of the second flip-flop 53, a channel select input which receives the third control signal Mode, and an output which serves as a signal output.

Referring to FIG. 11, the output boundary-scan cell 60 comprises a four-channel first multiplexer 61, a D-type first flip-flop 62, a D-type second flip-flop 63, a two-channel second multiplexer 64, and a two-input XOR gate 65. The XOR gate 65 has a first input which serves as a signal input, a second input which serves as a scan input, and an output. The first multiplexer 61 has a first data input which is connected to the first input of the XOR gate 65, a second data input which is connected to the output of the XOR gate 65, third and fourth data inputs which are connected to one another and which are further connected to the second input of the XOR gate 65, a pair of channel select inputs which receive the first control signal BIST* and the second control signal ShiftDR respectively, and an output. The first flip-flop 62 has a data input connected to the output of the first multiplexer 61, a clock input for receiving the first clock signal mClockDR, and an output which serves as a scan output. The second flip-flop 63 has a data input connected to the output of the first flip-flop 62, a clock input for receiving the second clock signal UpdateDR, and an output. The second multiplexer 64 has a first data input which is connected to the first input of the XOR gate 65, a second data input which is connected to the output of the second flip-flop 63, a channel select input which receives the third control signal Mode, and an output which serves as a signal output.

Referring to FIG. 12, the output boundary-scan cell 70 comprises a four-channel first multiplexer 71, a D-type first flip-flop 72, a D-type second flip-flop 73, a two-channel second multiplexer 74, and first and second two-input XOR gates 75, 76. The first XOR gate 75 has a first input which serves as a signal input, a second input which serves as a scan input, and an output. The second XOR gate 76 has a first input which is connected to the output of the first XOR gate 75, a second input which serves as a feedback input fb, and an output. The first multiplexer 71 has a first data input which is connected to the first input of the first XOR gate 75, a second data input which is connected to the output of the second XOR gate 76, third and fourth data inputs which are connected to one another and which are further connected to the second input of the first XOR gate 75, a pair of channel select inputs which receive the first control signal BIST* and the second control signal ShiftDR respectively, and an output. The first flip-flop 72 has a data input connected to the output of the first multiplexer 71, a clock input for receiving the first clock signal mClockDR, and an output which serves as a scan output. The second flip-flop 73 has a data input connected to the output of the first flip-flop 72, a clock input for receiving the second clock signal UpdateDR, and an output. The second multiplexer 74 has a first data input which is connected to the first input of the first XOR gate 75, a second data input which is connected to the output of the second flip-flop 73, a channel select input which receives the third control signal Mode, and an output which serves as a signal output.

Figure 13:
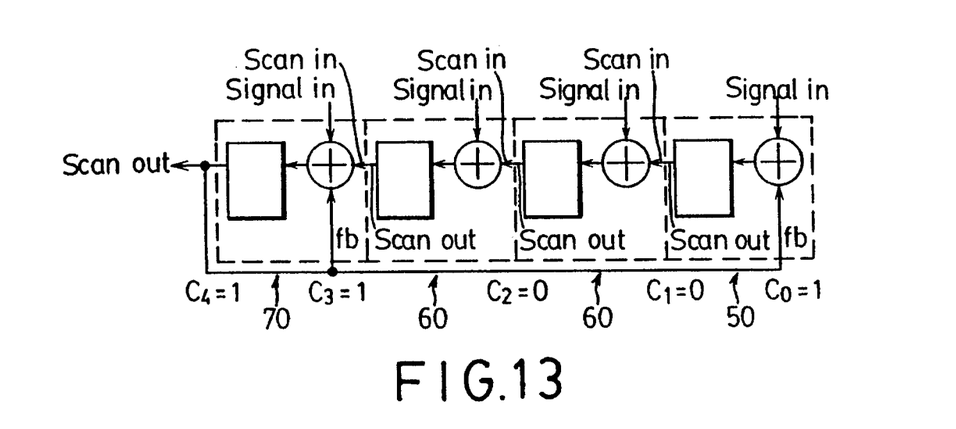
FIG. 13 illustrates how the family of output boundary-scan cells shown in FIGS. 10 to 12 are combined to form an MISR with a characteristic polynomial $p(x)=x^4+x^3+1$.

FIG. 13 illustrates how the output boundary-scan cells 50, 60, 70 are combined to form an MISR with a characteristic polynomial $p(x)=1+x^3+x^4$. The MISR has four cascaded stages that are arranged, from right to left, in the following manner: The first stage consists of the boundary-scan cell 50 and corresponds to a coefficient $c_0$ of the characteristic polynomial. The succeeding stages consist of the boundary-scan cell 60 if a coefficient $c_i$ of the characteristic polynomial is zero for $1 \leq i \leq n-1$, and consist of the boundary-scan cell 70 if the coefficient $c_i$ of the characteristic polynomial is one for $1 \leq i \leq n-1$. A previous stage corresponding to the coefficient $c_{i-1}$ of the characteristic polynomial is connected to a succeeding stage corresponding to the coefficient $c_i$ of the characteristic polynomial by connecting the scan output of the previous stage to the scan input of the succeeding stage. Feedback inputs of the different stages are connected to the scan output of a final stage corresponding to the coefficient $c_{n-1}$ of the characteristic polynomial.

As shown in FIG. 4, the conventional boundary-scan cell has the following I/O ports: Signal input, Signal output, Scan input, Scan output, Mode, ShiftDR, ClockDR and UpdateDR. Aside from possessing the ports of the conventional boundary-scan cell, the input and output boundary-scan cells 20, 30, 40, 50, 60, 70 of this invention further include additional I/O ports and XOR gates to reconfigure the same for use in an LFSR or MISR. The additional I/O ports receive the control signal BIST*, which is a low-active signal that should be logic 0 when BIST is to be performed and that should be logic 1 when otherwise, and the feedback input fb, which is the global feedback of LFSR or MISR. The XOR gates help the boundary-scan cells 20, 30, 40, 50, 60, 70 to behave as an LFSR or as an MISR.

Figure 14:
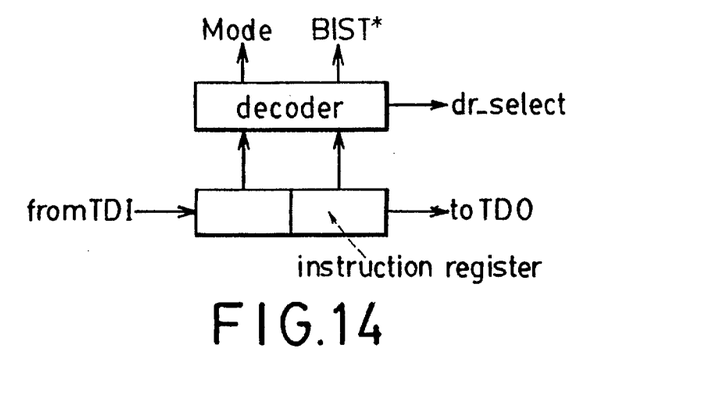
FIG. 14 illustrates the architecture of an instruction register and decoder for generating the various control signals for the boundary-scan cells of this invention.

In order to incorporate the BIST capability in the IEEE Std. 1149.1 boundary scan environment, an additional RUN-BIST test instruction is added to initiate BIST. In this embodiment, a two-bit instruction register is used to implement four test instructions: EXTEST, BYPASS, SAMPLE/PRELOAD and RUNBIST. The architecture of the instruction register and decoder is shown in FIG. 14. The control signal BIST* is a low-active signal that comes from the instruction decoder. The control signal BIST* should be logic 0 when the RUNBIST instruction is loaded into the instruction register and should be logic 1 when other instructions are loaded into the instruction register. The control signals Mode, BIST* control the behavior of the boundary-scan cells 20, 30, 40, 50, 60, 70. The control signal DR_select is used to select which data register output is to be provided to the TDO. Preferably, the control signal DR_select is generated to select the bypass register when the BYPASS test instruction is loaded into the instruction register.

Figure 15:
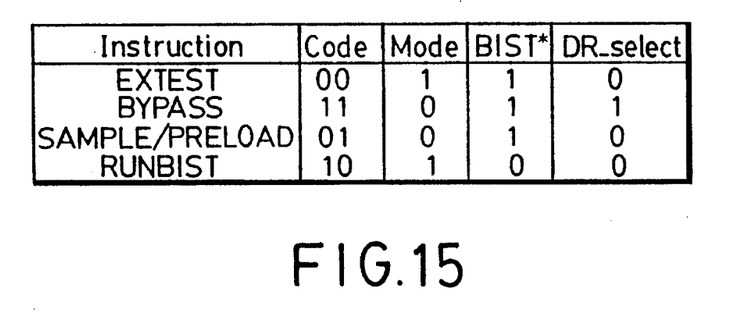
FIG. 15 is a table which shows the codes assigned to the different test instructions to be loaded into the instruction register, and the logic values of the different control signals in accordance with the test instructions.

FIG. 15 is a table which shows the codes assigned to the different test instructions, and the logic values of the different control signals in accordance with the test instructions.

Figure 16:
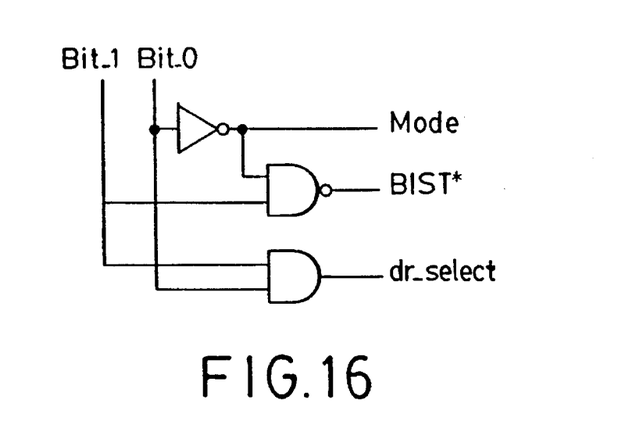
FIG. 16 is a schematic circuit diagram of an instruction decoder which complies with the table shown in FIG. 15.

To implement the instruction decoder shown in FIG. 14, the table shown in FIG. 15 is converted into truth tables for the control signals Mode, BIST*, DR_select. The instruction decoder is then implemented according to the resulting truth tables. The schematic circuit diagram of an instruction decoder for the present invention is shown in FIG. 16.

According to IEEE Std. 1149.1, BIST should be performed when the test access port (TAP) system of the boundary scan circuit is in the Run-Test/Idle state. In order to generate test patterns and compact circuit output responses in the Run-Test/Idle state, the original clock signal ClockDR used by the conventional boundary-scan cells and provided by the TAP system should be modified so that it can clock the test pattern generator and the output response analyzer in the Run-Test/Idle state.

Figure 17:
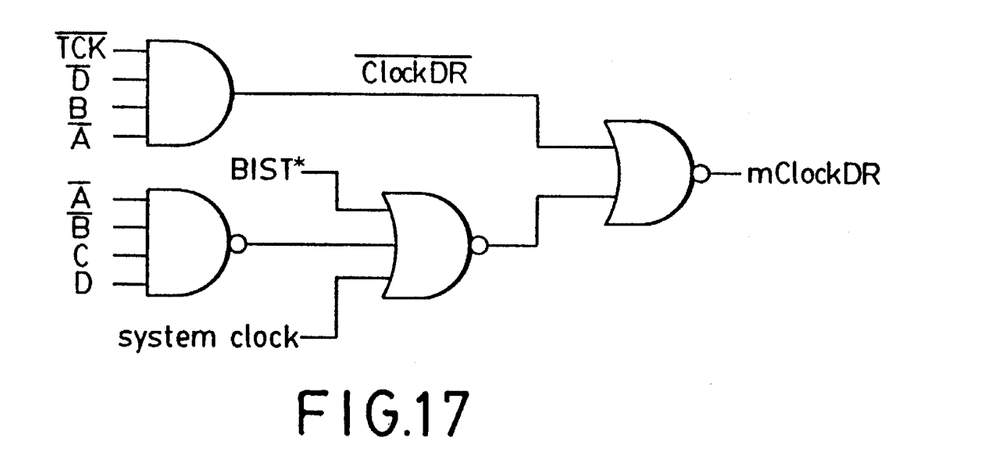
FIG. 17 is a schematic circuit diagram of a logic circuit for providing a system clock to the boundary-scan cells during a Run-Test/Idle controller state of the test access port (TAP) system.

FIG. 17 is a schematic circuit diagram of a logic circuit for modifying the original clock signal ClockDR so as to generate the modified clock signal mClockDR. The 4-bit binary word ABCD represents the encoded state of the TAP system. After the RUNBIST test instruction is loaded into the instruction register and the TAP system is in the Run-Test/Idle state (ABCD=0011), the clock signal mClockDR will behave as the system clock. Thus, the logic circuit of FIG. 17 serves primarily to provide the system clock to the input and output boundary-scan cells 20, 30, 40, 50, 60, 70 when BIST is performed.

Figure 18:
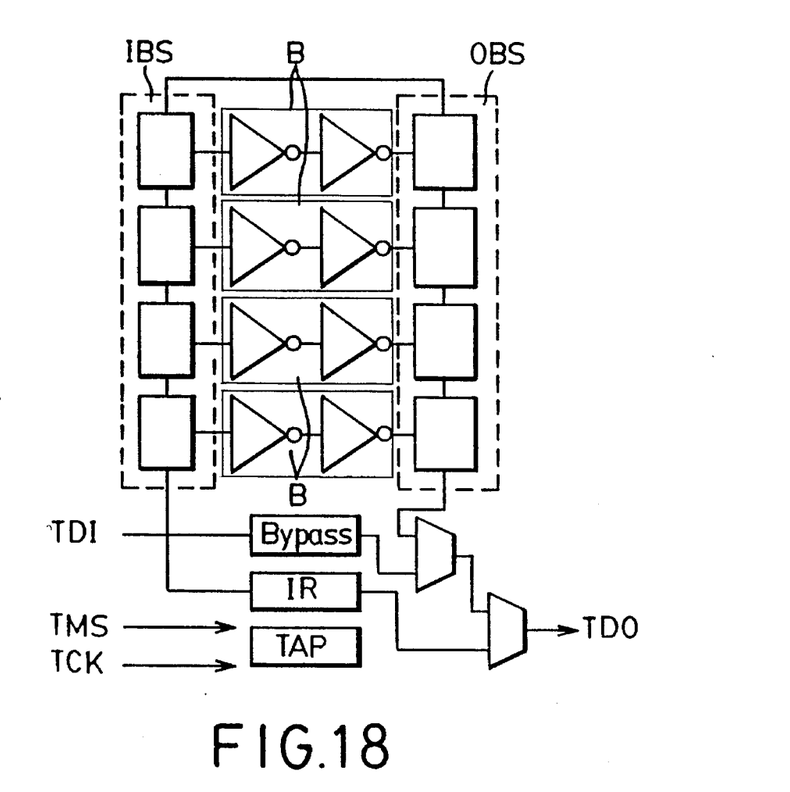
FIG. 18 is a sample logic circuit which incorporates the BIST boundary scan circuit of this invention.

FIG. 18 illustrates a sample logic circuit which incorporates the BIST boundary scan circuit of this invention. As shown, a 12-pin (excluding the Vdd and GND pins) integrated circuit chip has four buffer circuits B that serve as its logic circuit, and a boundary scan standard circuit which includes a TAP system with an instruction register IR, a bypass register BYPASS, an input boundary-scan register IBS having four input boundary-scan cells, and an output boundary-scan register OBS having four output boundary-scan cells. In this example, the conventional TAP system is modified in accordance with FIGS. 14, 16 and 17 so as to enable a TAP controller of the same to generate the control signal BIST* and the clock signal mClockDR, the input boundary-scan register IBS is configurable to correspond with the LFSR shown in FIG. 9, while the output boundary-scan register is configurable to correspond with the MISR shown in FIG. 13. Thus, aside from its ability to perform BIST, the boundary scan circuit of this invention still complies with IEEE Std. 1149.1.

When the RUNBIST instruction is loaded into the instruction register IR and is decoded, the control signal BIST* is at logic 0, and the control signal ShiftDR is similarly at logic 0. For the input boundary-scan register IBS, the multiplexers 21, 41 of the boundary-scan cells 20, 40 select the feedback input fb, while the multiplexer 31 of the boundary-scan cell 30 selects the scan input. The input boundary-scan register IBS acts as a test pattern generator for providing test patterns to the buffer circuits B at this time. On the other hand, for the output boundary-scan register OBS, the multiplexers 51, 61, 71 of the boundary-scan cells 50, 60, 70 select the output of the XOR gates 55, 75, 76 respectively. The output boundary-scan register OBS acts as an output response analyzer driven by the buffer circuits B at this time.

BIST of the sample logic circuit is performed as follows:

1. With the use of the SAMPLE/PRELOAD instruction, a seed value of the LFSR, such as 1111, and a seed value of the MISR, such as 0000, is loaded.

2. When the RUNBIST instruction is loaded and decoded, the control signal BIST* is generated, thereby configuring the input boundary-scan register IBS to operate as an LFSR and the output boundary-scan register IBS to operate as an MISR.

3. The TAP system is operated in the Run-Test/Idle state for a specified number of TCK cycles, such as 15 clock cycles, to complete BIST.

4. The result at the end of BIST is scanned out from the output boundary-scan register OBS (BIST,=0, ShiftDR=1) and is compared with a predetermined signature, such as 1001, to detect the presence of a fault.

It has thus been shown that no separate test pattern generator, output response analyzer and BIST controller is required in the BIST boundary scan circuitry of this invention. Thus, no substantial increase in the overall hardware overhead is incurred.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. The linear feedback shift register comprising cascaded input boundary-scan cells of an IEEE std. 1149.1 boundary scan circuit, said input boundary-scan cells forming an input boundary-scan register that is adapted to be connected to input nodes of a logic circuit of the boundary scan circuit, said input boundary-scan register being reconfigurable to operate as a test pattern generator that is adapted to provide test patterns to the logic circuit for a predetermined number of clock cycles upon receipt of a built-in self-test control signal from a test access port system of the boundary scan circuit, wherein:

each of said input boundary-scan cells is one of a first cell, a second cell and a third cell;

said first cell includes: a four-channel first multiplexer having a first data input which serves as a signal input, a second data input which serves as a feedback input, third and fourth data inputs which are connected to one another and which serve as a scan input, a pair of channel select inputs which are adapted to receive a first control signal (BIST*) and a second control signal (ShiftDR) respectively, and an output; a D-type flip-flop having a data input connected to said output of said first multiplexer, a clock input adapted to receive a clock signal (mClockDR), and an output which serves as a scan output; and a two-channel second multiplexer having a first data input which is connected to said first data input of said first multiplexer, a second data input which is connected to said output of said flip-flop, a channel select input which is adapted to receive a third control signal (Mode), and an output which serves as a signal output;

said second cell includes: a four-channel first multiplexer having a first data input which serves as a signal input, second, third and fourth data inputs which are connected to one another and which serve as a scan input, a pair of channel select inputs which are adapted to receive said first control signal (BIST*) and said second control signal (ShiftDR) respectively, and an output; a D-type flip-flop having a data input connected to said output of said first multiplexer, a clock input which is adapted to receive said clock signal (mClockDR), and an output which serves as a scan output; and a two-channel second multiplexer having a first data input which is connected to said first data input of said first multiplexer, a second data input which is connected to said output of said flip-flop, a channel select input which is adapted to receive said third control signal (Mode), and an output which serves as a signal output; and said third cell includes: a two-input XOR gate having a first input which serves as a feedback input, a second input which serves as a scan input, and an output; a four-channel first multiplexer having a first data input which serves a signal input, a second data input which is connected to said output of said XOR gate, third and fourth data inputs which are connected to one another and which are further connected to said second input of said XOR gate, a pair of channel select inputs which are adapted to receive said first control signal (BIST*) and said second control signal (ShiftDR) respectively, and an output; a D-type flip-flop having a data input connected to said output of said first multiplexer, a clock input which is adapted to receive said clock signal (mClockDR), and an output which serves as a scan output; and a two-channel second multiplexer having a first data input which is connected to said first data input of said first multiplexer, a second data input which is connected to said output of said flip-flop, a channel select input which is adapted to receive said third control signal (Mode), and an output which serves as a signal output.

2. The linear feedback shift register according to claim 1, wherein:

said linear feedback shift register has a characteristic polynomial $p(x)=1+c_1x+c_2x^2+\ldots+c_nx^n$;

a first one of said input boundary-scan cells is said first cell and corresponds to a coefficient $c_0$ of the characteristic polynomial; and a succeeding one of said input boundary-scan cells is said second cell if a coefficient $c_i$ of the characteristic polynomial is zero for $1 \leq i \leq n-1$, and is said third cell if the coefficient $c_i$ of the characteristic polynomial is one for $1 \leq i \leq n-1$.

3. The linear feedback shift register according to claim 2, wherein a previous one of said input boundary-scan cells corresponding to the coefficient $c_{i-1}$ of the characteristic polynomial is connected to a succeeding one of said input boundary-scan cells corresponding to the coefficient $c_i$ of the characteristic polynomial by connecting said scan output of said previous one to said scan input of said succeeding one, said feedback inputs of said first and third cells being connected to said scan output of a final one of said input boundary-scan cells corresponding to the coefficient $c_{n-1}$ of the characteristic polynomial.

4. A multiple-input shift register, comprising cascaded output boundary-scan cells of an IEEE Std. 1149.1 boundary scan circuit, said output boundary-scan cells forming an output boundary-scan register that is adapted to be connected to output nodes of a logic circuit of the boundary scan circuit, said output boundary-scan register being reconfigurable to operate as an output response analyzer driven by the logic circuit for a predetermined number of clock cycles upon receipt of a built-in self-test control signal from a test access port system of the boundary scan circuit, contents of said output boundary-scan register being scannable for comparison with a predetermined signature to detect presence of a fault after said predetermined number of clock cycles.

5. The multiple-input shift register according to claim 4, wherein:

each of said output boundary-scan cells is one of a first cell, a second cell and a third cell;

said first cell includes: a two-input XOR gate having a first input which serves as a signal input, a second input which serves as a feedback input, and an output; a four-channel first multiplexer having a first data input which is connected to said first input of said XOR gate, a second data input which is connected to said output of said XOR gate, third and fourth data inputs which are connected to one another and which serve as scan inputs, a pair of channel select inputs which are adapted to receive a first control signal (BIST*) and a second control signal (ShiftDR) respectively, and an output; a D-type first flip-flop having a data input connected to said output of said first multiplexer, a clock input adapted to receive a first clock signal (mClockDR), and an output which serves as a scan output; a D-type second flip-flop having a data input connected to said output of said first flip-flop, a clock input adapted to receive a second clock signal (UpdateDR), and an output; and a two-channel second multiplexer having a first data input which is connected to said first input of said XOR gate, a second data input which is connected to said output of said second flip-flop, a channel select input which is adapted to receive a third control signal (Mode), and an output which serves as a signal output;

said second cell includes: a two-input XOR gate having a first input which serves as a signal input, a second input which serves as a scan input, and an output; a four-channel first multiplexer having a first data input which is connected to said first input of said XOR gate, a second data input which is connected to said output of said XOR gate, third and fourth data inputs which are connected to one another and which are further connected to said second input of said XOR gate, a pair of channel select inputs which are adapted to receive said first control signal (BIST*) and said second control signal (ShiftDR) respectively, and an output; a D-type first flip-flop having a data input connected to said output of said first multiplexer, a clock input adapted to receive said first clock signal (mClockDR), and an output which serves as a scan output; a D-type second flip-flop having a data input connected to said output of said first flip-flop, a clock input adapted to receive said second clock signal (UpdateDR), and an output; and a two-channel multiplexer having a first data input which is connected to said first input of said XOR gate, a second data input which is connected to said output of said second flip-flop, a channel select input which is adapted to receive said third control signal (Mode), and an output which serves as a signal output; and said third cell includes: a two-input first XOR gate having a first input which serves as a signal input, a second input which serves as a scan input, and an output; a two-input second XOR gate having a first input which is connected to said output of said first XOR gate, a second input which serves as a feedback input, and an output; a four-channel first multiplexer having a first data input which is connected to said first input of said first XOR gate, a second data input which is connected to said output of said second XOR gate, third and fourth data inputs which are connected to one another and which are further connected to said second input of said first XOR gate, a pair of channel select inputs which are adapted to receive said first control signal (BIST*) and said second control signal (ShiftDR) respectively, and an output; a D-type first flip-flop having a data input connected to said output of said first multiplexer, a clock input adapted to receive said first clock signal (mClockDR), and an output which serves as a scan output; a D-type second flip-flop having a data input connected to said output of said first flip-flop, a clock input adapted to receive said second clock signal (UpdateDR), and an output; and a two-channel second multiplexer having a first data input which is connected to said first input of said first XOR gate, a second data input which is connected to said output of said second flip-flop, a channel select input which is adapted to receive said third control signal (Mode), and an output which serves as a signal output.

6. The multiple-input shift register according to claim 5, wherein:

said multiple-input shift register has a characteristic polynomial $p(x)=1+c_1 x+c_2 x^2+\ldots+c_n x^n$;

a first one of said output boundary-scan cells is said first cell and corresponds to a coefficient $c_0$ of the characteristic polynomial; and a succeeding one of said output boundary-scan cells is said second cell if a coefficient $c_i$ of the characteristic polynomial is zero for $1 \leq i \leq n-1$, and is said third cell if the coefficient $c_i$ of the characteristic polynomial is one for $1 \leq i \leq n-1$.

7. The multiple-input shift register according to claim 6, wherein a previous one of said output boundary-scan cells corresponding to the coefficient $c_{i-1}$ of the characteristic polynomial is connected to a succeeding one of said output boundary-scan cells corresponding to the coefficient $c_i$ of the characteristic polynomial by connecting said scan output of said previous one to said scan input of said succeeding one, said feedback inputs of said first and third cells being connected to said scan output of a final one of said output boundary-scan cells corresponding to the coefficient $c_{n-1}$ of the characteristic polynomial.

8. An input boundary-scan cell for an IEEE Std. 1149.1 boundary scan circuit, said input boundary-scan cell forming a part of an input boundary-scan register that is connected to input nodes of a logic circuit of said boundary scan circuit and that is reconfigurable so as to operate as a test pattern generator which provides test patterns to said logic circuit for a predetermined number of clock cycles upon receipt of a built-in self-test control signal from a test access port system of said boundary scan circuit when executing built-in self-testing, said input boundary-scan cell comprising:

a four-channel first multiplexer having a first data input which serves as a signal input, a second data input which serves as a feedback input, third and fourth data inputs which are connected to one another and which serve as a scan input, a pair of channel select inputs which are adapted to receive a first control signal (BIST*) and a second control signal (ShiftDR) respectively, and an output;

a D-type flip-flop having a data input connected to said output of said first multiplexer, a clock input adapted to receive a clock signal (mClockDR), and an output which serves as a scan output; and a two-channel second multiplexer having a first data input which is connected to said first data input of said first multiplexer, a second data input which is connected to said output of said flip-flop, a channel select input which is adapted to receive a third control signal (Mode), and an output which serves as a signal output.

9. An input boundary-scan cell for an IEEE Std. 1149.1 boundary scan circuit, said input boundary-scan cell forming a part of an input boundary-scan register that is connected to input nodes of a logic circuit of said boundary scan circuit and that is reconfigurable so as to operate as a test pattern generator which provides test patterns to said logic circuit for a predetermined number of clock cycles upon receipt of a built-in self-test control signal from a test access port system of said boundary scan circuit when executing built-in self-testing, said input boundary-scan cell comprising:

a four-channel first multiplexer having a first data input which serves as a signal input, second, third and fourth data inputs which are connected to one another and which serve as a scan input, a pair of channel select inputs which are adapted to receive a first control signal (BIST*) and a second control signal (ShiftDR) respectively, and an output;

a D-type flip-flop having a data input connected to said output of said first multiplexer, a clock input which is adapted to receive a clock signal (mClockDR), and an output which serves as a scan output; and a two-channel second multiplexer having a first data input which is connected to said first data input of said first multiplexer, a second data input which is connected to said output of said flip-flop, a channel select input which is adapted to receive a third control signal (Mode), and an output which serves as a signal output.

10. An input boundary-scan cell for an IEEE Std. 1149.1 boundary scan circuit, said input boundary-scan cell forming a part of an input boundary-scan register that is connected to input nodes of a logic circuit of said boundary scan circuit and that is reconfigurable so as to operate as a test pattern generator which provides test patterns to said logic circuit for a predetermined number of clock cycles upon receipt of a built-in self-test control signal from a test access port system of said boundary scan circuit when executing built-in self-testing, said input boundary-scan cell comprising:

a two-input XOR gate having a first input which serves as a feedback input, a second input which serves as a scan input, and an output;

a four-channel first multiplexer having a first data input which serves as a signal input, a second data input which is connected to said output of said XOR gate, third and fourth data inputs which are connected to one another and which are further connected to said second input of said XOR gate, a pair of channel select inputs which are adapted to receive a first control signal (BIST*) and a second control signal (ShiftDR) respectively, and an output;

a D-type flip-flop having a data input connected to said output of said first multiplexer, a clock input which is adapted to receive a clock signal (mClockDR), and an output which serves as a scan output; and a two-channel second multiplexer having a first data input which is connected to said first data input of said first multiplexer, a second data input which is connected to said output of said flip-flop, a channel select input which is adapted to receive a third control signal (Mode), and an output which serves as a signal output.

11. An output boundary-scan cell for an IEEE Std. 1149.1 boundary scan circuit, said output boundary-scan cell forming a part of an output boundary-scan register that is connected to output nodes of a logic circuit of said boundary scan circuit and that is reconfigurable so as to operate as an output response analyzer which is driven by said logic circuit for a predetermined number of clock cycles upon receipt of a built-in self-test control signal from a test access port system of said boundary scan circuit when executing built-in self-testing, said output boundary-scan cell comprising:

a two-input XOR gate having a first input which serves as a signal input, a second input which serves as a feedback input, and an output;

a four-channel first multiplexer having a first data input which is connected to said first input of said XOR gate, a second data input which is connected to said output of said XOR gate, third and fourth data inputs which are connected to one another and which serve as scan inputs, a pair of channel select inputs which are adapted to receive a first control signal (BIST*) and a second control signal (ShiftDR) respectively, and an output;

a D-type first flip-flop having a data input connected to said output of said first multiplexer, a clock input adapted to receive a first clock signal (mClockDR), and an output which serves as a scan output;

a D-type second flip-flop having a data input connected to said output of said first flip-flop, a clock input adapted to receive a second clock signal (UpdateDR), and an output; and a two-channel second multiplexer having a first data input which is connected to said first input of said XOR gate, a second data input which is connected to said output of said second flip-flop, a channel select input which is adapted to receive a third control signal (Mode), and an output which serves as a signal output.

12. An output boundary-scan cell for an IEEE Std. 1149.1 boundary scan circuit, said output boundary-scan cell forming a part of an output boundary-scan register that is connected to output nodes of a logic circuit of said boundary scan circuit and that is reconfigurable so as to operate as an output response analyzer which is driven by said logic circuit for a predetermined number of clock cycles upon receipt of a built-in self-test control signal from a test access port system of said boundary scan circuit when executing built-in self-testing, said output boundary-scan cell comprising:

a two-input XOR gate having a first input which serves as a signal input, a second input which serves as a scan input, and an output;

a four-channel first multiplexer having a first data input which is connected to said first input of said XOR gate, a second data input which is connected to said output of said XOR gate, third and fourth data inputs which are connected to one another and which are further connected to said second input of said XOR gate, a pair of channel select inputs which are adapted to receive a first control signal (BIST*) and a second control signal (ShiftDR) respectively, and an output;

a D-type first flip-flop having a data input connected to said output of said first multiplexer, a clock input adapted to receive a first clock signal (mClockDR), and an output which serves as a scan output;

a D-type second flip-flop having a data input connected to said output of said first flip-flop, a clock input adapted to receive a second clock signal (UpdateDR), and an output; and a two-channel second multiplexer having a first data input which is connected to said first input of said XOR gate, a second data input which is connected to said output of said second flip-flop, a channel select input which is adapted to receive a third control signal (Mode), and an output which serves as a signal output.

13. An output boundary-scan cell for an IEEE Std. 1149.1 boundary scan circuit, said output boundary-scan cell forming a part of an output boundary-scan register that is connected to output nodes of a logic circuit of said boundary scan circuit and that is reconfigurable so as to operate as an output response analyzer which is driven by said logic circuit for a predetermined number of clock cycles upon receipt of a built-in self-test control signal from a test access port system of said boundary scan circuit when executing built-in self-testing, said output boundary-scan cell comprising:

a two-input first XOR gate having a first input which serves as a signal input, a second input which serves as a scan input, and an output;

a two-input second XOR gate having a first input which is connected to said output of said first XOR gate, a second input which serves as a feedback input, and an output;

a four-channel first multiplexer having a first data input which is connected to said first input of said first XOR gate, a second data input which is connected to said output of said second XOR gate, third and fourth data inputs which are connected to one another and which are further connected to said second input of said first XOR gate, a pair of channel select inputs which are adapted to receive a first control signal (BIST*) and a second control signal (ShiftDR) respectively, and an output;

a D-type first flip-flop having a data input connected to said output of said first multiplexer, a clock input adapted to receive a first clock signal (mClockDR), and an output which serves as a scan output;

a D-type second flip-flop having a data input connected to said output of said first flip-flop, a clock input adapted to receive a second clock signal (UpdateDR), and an output; and a two-channel second multiplexer having a first data input which is connected to said first input of said first XOR gate, a second data input which is connected to said output of said second flip-flop, a channel select input which is adapted to receive a third control signal (Mode), and an output which serves as a signal output.

* * * * *